(12) United States Patent
Ahn et al.

(10) Patent No.: US 7,998,758 B2
(45) Date of Patent: Aug. 16, 2011

(54) METHOD OF FABRICATING A MAGNETIC STACK DESIGN WITH DECREASED SUBSTRATE STRESS

(75) Inventors: Yongchul Ahn, Eagan, MN (US); Shuiyuan Haung, Apple Valley, MN (US); Antoine Khoueir, Apple Valley, MN (US); Paul Anderson, Eden Prairie, MN (US); Lili Jia, Edina, MN (US); Christina Laura Hutchinson, Eden Prairie, MN (US); Ivan Ivanov, Apple Valley, MN (US); Dimitar Dimitrov, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 289 days.

(21) Appl. No.: 12/389,422

(22) Filed: Feb. 20, 2009

(65) Prior Publication Data

US 2010/0109107 A1 May 6, 2010

Related U.S. Application Data

(60) Provisional application No. 61/111,357, filed on Nov. 5, 2008.

(51) Int. Cl.
*H01L 29/04* (2006.01)
*H01L 29/82* (2006.01)

(52) U.S. Cl. ............... 438/3; 257/421; 257/E29.323

(58) Field of Classification Search .................. None
See application file for complete search history.

(56) References Cited

U.S. PATENT DOCUMENTS

| 6,759,263 | B2 | | 7/2004 | Ying et al. | |
|---|---|---|---|---|---|
| 7,098,494 | B2 | * | 8/2006 | Pakala et al. | 257/295 |
| 7,572,645 | B2 | * | 8/2009 | Sun et al. | 438/3 |
| 7,723,128 | B2 | * | 5/2010 | Wang et al. | 438/3 |
| 2004/0170055 | A1 | * | 9/2004 | Albert et al. | 365/173 |
| 2007/0054450 | A1 | | 3/2007 | Hong et al. | |
| 2007/0120210 | A1 | | 5/2007 | Yuan et al. | |
| 2008/0225585 | A1 | * | 9/2008 | Ranjan et al. | 365/173 |
| 2010/0102406 | A1 | * | 4/2010 | Xi et al. | 257/421 |
| 2010/0109085 | A1 | * | 5/2010 | Kim et al. | 257/364 |

OTHER PUBLICATIONS

U.S. Appl. No. 12/268,638, filed Nov. 11, 2008, Anderson.

* cited by examiner

*Primary Examiner* — Alonzo Chambliss
(74) *Attorney, Agent, or Firm* — Campbell Nelson Whipps LLC

(57) ABSTRACT

A magnetic element and a method for making a magnetic element. The method includes patterning a first electrode material to form a first electrode on a substrate and depositing filler material on the substrate around the first electrode. The method further includes polishing to form a planar surface of filler and the first electrode. A magnetic cell is formed on the planar surface and a second electrode is formed on the magnetic cell. In some embodiments, the first electrode has an area that is at least 2:1 to the area of the magnetic cell.

13 Claims, 8 Drawing Sheets

METHOD OF FABRICATING A MAGNETIC STACK DESIGN WITH DECREASED SUBSTRATE STRESS

RELATED APPLICATIONS

This application claims priority to U.S. provisional patent application No. 61/111,357, filed on Nov. 5, 2008 and titled "High Quality Magnetic Stack Process Integration by Minimizing Substrate Stress Relaxation to MTJ". The entire disclosure of application No. 61/111,357 is incorporated herein by reference.

BACKGROUND

Spin torque transfer technology, also referred to as spin transfer or spin torque, combines semiconductor technology and magnetics. In spin torque transfer, the spin of electrons, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation, and a non-magnetic barrier layer therebetween. Any of these layers may be multi-layers. The magnetization orientations of the free layer and the pinned layer define the resistance of the overall magnetic element. Such an element is generally referred to as a "spin tunneling junction," "magnetic tunnel junction", "magnetic tunnel junction cell", and the like. When the magnetization orientations of the free layer and pinned layer are parallel, the resistance of the element is low. When the magnetization orientations of the free layer and the pinned layer are antiparallel, the resistance of the element is high.

At least because of their small size, it is desirous to use magnetic elements in many applications, such as magnetic hard disk drive read heads, magnetic sensors, and non-volatile random access memory. Their small size, however, presents some difficulties. Improvements and developments in magnetic cells and their manufacture are always desired.

BRIEF SUMMARY

The present disclosure relates to methods of making magnetic elements, such as magnetic tunnel junction cells and other cells for spin torque random access memory (ST RAM). The methods provide magnetic elements on a substrate, with reduced substrate stress.

In one particular embodiment, this disclosure provides a method for making a magnetic element. The method includes patterning a first electrode material to form a first electrode on a substrate and depositing filler material on the substrate around the first electrode. The method includes polishing to form a planar surface of filler and the first electrode. A magnetic cell is formed on the planar surface and a second electrode is formed on the magnetic cell.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
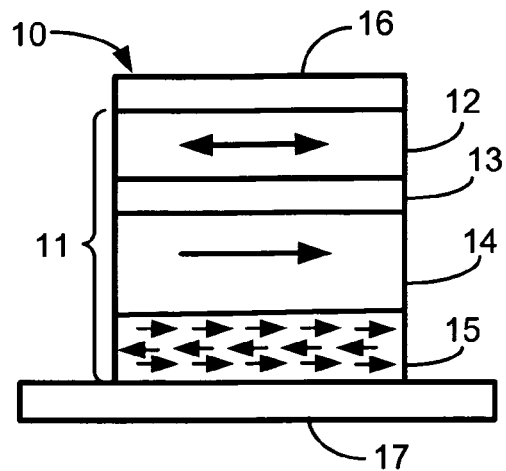
FIG. 1 is a cross-sectional schematic diagram of an illustrative magnetic element with in-plane magnetization orientation.

This disclosure is directed to magnetic memory elements and methods of making those elements. The methods provide high quality magnetic stack process integration flow by minimizing substrate stress perturbation to magnetic memory elements, such as those for spin-torque memory.

One of the process integration methods of this disclosure for forming a magnetic element includes forming the bottom electrode prior to the adjacent cell (i.e., "BE first"). It has been found, based upon magnetic switching and bottom electrode substrate stress relaxation studies, that forming the shape of the bottom electrode prior to forming the magnetic cell produces less stress effect on the magnetic memory element and alters less the magnetic responses from the originally designed axes. Another of the process integration methods of this disclosure includes forming the bottom electrode with an increased area, either by forming the shape of bottom electrode prior to the adjacent cell (i.e., "BE first") or by forming the shape of the bottom electrode after the adjacent cell (i.e., "BE last"). A bottom electrode having increased area has been found, based upon magnetic switching and substrate stress relaxation studies, to provide less stress effect to the magnetic memory element and to alter less the magnetic responses from the originally designed axes. In some embodiments, these magnetic elements have zero intrinsic stress or near-zero intrinsic stress.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure is directed to methods of making memory cells that result in reduced substrate stress. The magnetic elements may have zero intrinsic stress or near-zero intrinsic stress. While the present disclosure is not so limited, an appreciation of various aspects of the disclosure will be gained through a discussion of the examples provided below.

FIG. 1 is a cross-sectional schematic diagram of an illustrative magnetic element that can be formed by the methods of this disclosure. Element 10 of FIG. 1 may be referred to as a magnetic tunnel junction cell, variable resistive memory cell or variable resistance memory cell or the like. Magnetic element 10 includes magnetic cell 11 composed of a ferromagnetic free layer 12 and a ferromagnetic reference (i.e., pinned) layer 14. Ferromagnetic free layer 12 and ferromagnetic pinned layer 14 are separated by a non-magnetic spacer layer 13. Proximate ferromagnetic pinned layer 14 is an optional antiferromagnetic (AFM) pinning layer 15, which pins the magnetization orientation of ferromagnetic pinned layer 14 by exchange bias with the antiferromagnetically ordered material of pinning layer 15. Examples of suitable pinning materials include PtMn, IrMn, and others. Note that other layers, such as seed or capping layers, are not depicted for clarity.

Ferromagnetic layers 12, 14 may be made of any useful ferromagnetic (FM) material such as, for example, Fe, Co or Ni and alloys thereof, such as NiFe and CoFe, and ternary alloys, such as CoFeB. Either or both of free layer 12 and pinned layer 14 may be either a single layer or a synthetic antiferromagnetic (SAF) coupled structure, i.e., two ferromagnetic sublayers separated by a metallic spacer, such as Ru or Cr, with the magnetization orientations of the sublayers in opposite directions to provide a net magnetization. Free layer 12 may be a synthetic ferromagnetic coupled structure, i.e., two ferromagnetic sublayers separated by a metallic spacer, such as Ru or Ta, with the magnetization orientations of the sublayers in parallel directions. Either or both layer 12, 14 are often about 0.1-10 nm thick, depending on the material and the desired resistance and switchability of free layer 12.

If magnetic element 10 is a magnetic tunnel junction cell, non-magnetic spacer layer 13 is an insulating barrier layer sufficiently thin to allow tunneling of charge carriers between pinned layer 14 and free layer 12. Examples of suitable electrically insulating material include oxides material (e.g., $Al_2O_3$, $TiO_x$ or MgO). If magnetic element 10 is a spin-valve cell, non-magnetic spacer layer 13 is a conductive non-magnetic spacer layer. For either a magnetic tunnel junction cell or a spin-valve, non-magnetic spacer layer 13 could optionally be patterned with free layer 12 or with pinned layer 14, depending on process feasibility and device reliability.

The resistance across magnetic element 10 is determined by the relative orientation of the magnetization vectors or magnetization orientations of ferromagnetic layers 12, 14. The magnetization direction of ferromagnetic pinned layer 14 is pinned in a predetermined direction by pinning layer 15 while the magnetization direction of ferromagnetic free layer 12 is free to rotate under the influence of spin torque. In FIG. 1, the magnetization orientation of free layer 12 is illustrated as undefined. In some embodiments, magnetic tunnel junction element 10 is in the low resistance state or "0" data state where the magnetization orientation of free layer 12 is in the same direction or parallel to the magnetization orientation of pinned layer 14. In other embodiments, magnetic tunnel junction element 10 is in the high resistance state or "1" data state where the magnetization orientation of free layer 12 is in the opposite direction or anti-parallel to the magnetization orientation of pinned layer 14.

Switching the resistance state and hence the data state of magnetic element 10 via spin-transfer occurs when a current, under the influence of a magnetic layer of magnetic element 10, becomes spin polarized and imparts a spin torque on free layer 12 of magnetic element 10. When a sufficient level of polarized current and therefore spin torque is applied to free layer 12, the magnetization orientation of free layer 12 can be changed among different directions and accordingly, magnetic element 10 can be switched between the parallel state, the anti-parallel state, and other states.

Electrically connected to cell 11 are a first or top electrode 16 and a second or bottom electrode 17. It is to be understood that the designations "top" and "bottom" are not to be limiting in their special relationship, but are merely used to facilitate understanding of the figures. In the following discussion, the term "top" is interchangeable with "first" and "bottom" is interchangeable with "second". First electrode 16 is in electrical contact with ferromagnetic free layer 12 and second electrode 17 is in electrical contact with ferromagnetic pinned layer 14 via pinning layer 15. In this embodiment, second electrode 17 has a larger area (e.g., width and/or length) than cell 11. Electrodes 16, 17 electrically connect ferromagnetic layers 12, 14 to a control circuit providing read and write currents through layers 12, 14. Examples of materials for electrodes 16, 17 are conducting metal materials; suitable materials include TiN, TaN and Cu.

The illustrative magnetic element 10 is used to construct a memory device where a data bit is stored in the spin torque memory cell by changing the relative magnetization state of free layer 12 with respect to pinned layer 14. The stored data bit can be read out by measuring the resistance of element 10 which changes with the magnetization direction of free layer 12 relative to pinned layer 14.

Figure 2:
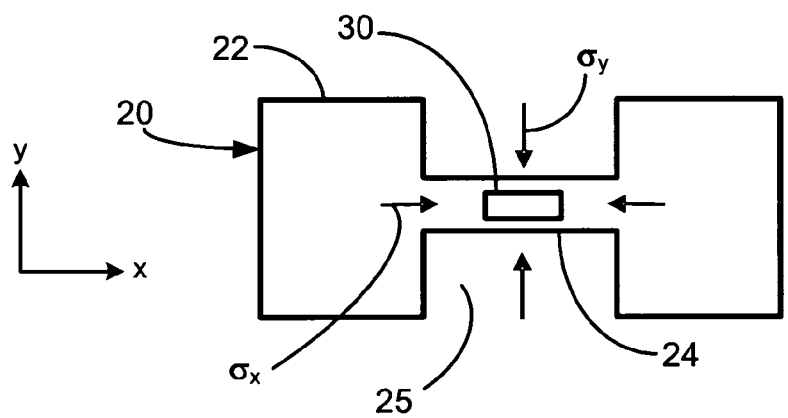
FIG. 2 is a schematic top view of a magnetic element.

Referring to FIG. 2, a top view of magnetic cell 30 is illustrated positioned on bottom electrode 20, similar to magnetic cell 11 on bottom electrode 17 of FIG. 1. Magnetic cell 30 may be, for example, magnetic cell 11, described above.

Magnetic cell 30 includes a ferromagnetic pinned layer with a set magnetization orientation and a ferromagnetic layer with a switchable magnetization orientation, with the pinned layer electrically connected to bottom electrode 20. Magnetic cell 30 and electrode 20 may have been prepared by forming the shape of bottom electrode 20 after the formation of cell 30, in a "bottom electrode last" or "BE last" procedure; this forming of electrode 20 and cell 30 is illustrated in FIGS. 4A-4F and described below. Alternately, magnetic cell 30 and electrode 20 may have been prepared by forming the shape of bottom electrode 20 prior to the formation of cell 30, in a "bottom electrode first" or "BE first" procedure; this forming of electrode 20 and cell 30 is illustrated in FIGS. 8A-8H and described below.

Bottom electrode 20 has a dog-bone, "H", dumbbell or similar shape, having opposite body portions 22 separated by a necked portion 24. Necked potion 24 has a smaller width, taken in the y-direction, than body portions 22. Between body portions 22, on each side of necked portion 24, is free space 25. Bottom electrode 20 is an electrically conductive material, in most embodiments a metal material; examples of suitable materials for bottom electrode 20 include TiN, TaN and Cu.

Magnetic cell 30 on bottom electrode 20 can be a typical magnetic element test structure for characterization of a single magnetic tunnel junction (MTJ) device. Illustrated on FIG. 2 are stress vectors from bottom electrode 20 that represent the stresses of bottom electrode 20 as they affect cell 30.

Figure 3:
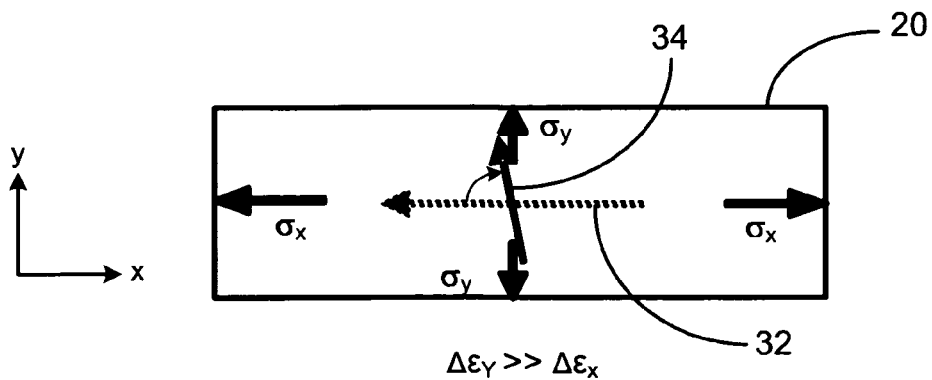
FIG. 3 is a schematic illustrating the substrate stress relaxation effect on a bottom electrode of a magnetic element made by a "BE last" process.

FIG. 3 illustrates the designed easy axis 32 and the actual easy axis 34 of magnetic cell 30, when bottom electrode 20 and magnetic cell 30 are formed by a "BE last" process of FIGS. 4A-4H. Also illustrated in FIG. 3 are internal compressive stress vectors σ (sigma) for the major or x-axis of electrode 20 and for the minor or y-axis of electrode 20 which are induced by the stresses of cell 30 onto bottom electrode 20. These compressive stress vectors are designated as $\sigma_x$ and $\sigma_y$, respectively. A similar effect is observed for tensile stress in bottom electrode 20; these stress vectors would be similar, yet in the opposite direction as the compressive stress vectors. The change in strain on the electrode is proportional to the change in stress. FIG. 3 also designates the change in strain $\epsilon$ (epsilon) that results from stress relaxation (i.e., the change in the stress).

As indicated in FIG. 3, the process of patterning of bottom electrode 20 with an aspect ratio (i.e., length in x-direction/width in y-direction) greater than 1 (i.e., $L_x/L_y \gg 1$) will cause stress relaxation in both the x- and y-directions. In other words, changes in the original components of intrinsic stress vectors $\sigma_x$ and $\sigma_y$, along the x and y-axis, respectively, to $\sigma L_x$ and $\sigma L_y$, changes the original dimensions $L_x$ and $L_y$, of the top surface plane by $\Delta L_x$ and $\Delta L_y$, in such a way that the change in the y-direction is much greater than the change in the x-direction (i.e., $\Delta L_y/L_y \gg \Delta L_x/L_x$). This will cause asymmetric changes in the original strains $\epsilon_x$ and $\epsilon_y$, by $\Delta \epsilon_y \gg \Delta \epsilon_x$, where $$\Delta\epsilon_x = \Delta L_x/L_x$$

$$\Delta\epsilon_y = \Delta L_y/L_y$$

As an example, as a result of such stress relaxation, the relative dimension change $\Delta L_x/L_x$ in the x-direction may be about 0.1%, whereas the dimension change $\Delta L_y/L_y$ in the y-direction may be about 0.8%. The magnitude of these relative geometrical changes will transfer to the relative geometric change in the magnetic sensor, thus causing stress-induced magnetic anisotropy.

When shaping bottom electrode 20 after the shaping of magnetic cell 30 (via a "BE last" process), the forming and patterning of bottom electrode 20 creates stress relaxation within then electrode 20 which then propagates a stress into adjacent magnetic cell 30. The bottom electrode material (e.g., TiN) has intrinsic compressive stress, which bows electrode 20. FIG. 2 illustrates this phenomenon, illustrating the stress vectors compressing electrode 20 and cell 30. When bottom electrode 20 is patterned, its film stress relaxes to create a compressive stress and, thereby, induces the tensile stresses into magnetic cell 30 internally along both the x- and y-directions, as illustrated in FIG. 3.

FIGS. 4A-4F illustrate a "BE last" method for making a magnetic element where the bottom electrode is shaped or patterned after the magnetic cell is formed, as is magnetic cell 30 on electrode 20.

Figure 4A:
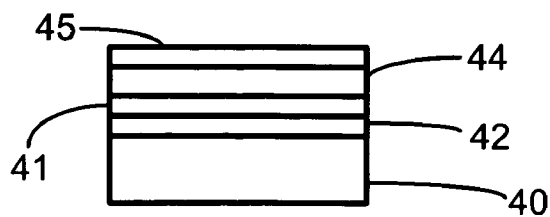
FIGS. 4A-4F are schematic step-wise diagrams of a "BE last" method of making a magnetic element according to this disclosure, such as the element of FIG. 2.

In FIG. 4A, a substrate 40 is provided as the base for the magnetic element. Substrate 40 may be, for example, a dielectric or an oxide material such as $SiO_2$, $Al_2O_3$, FSG (fluorinated silicate glass), doped $SiO_2$, SiN or MgO. Bottom electrode material 42 is provided on substrate 40. A magnetic cell layer 41 is present between bottom electrode material 42 and a top electrode material 44. Electrode materials 42, 44 are electrically conductive materials and are usually metal materials. Examples of suitable materials for electrode materials 42, 44 include TiN, TaN, Cu, and W. Electrode materials 42, 44 may have the same or different materials, and may have the same or different thicknesses. In some embodiments, bottom electrode material 42 has a thickness of about 1000 Å and top electrode material 44 has a thickness of about 2000 Å. Magnetic cell layer 41 includes two ferromagnetic layers and a spacer layer therebetween. In some embodiments, the thickness of magnetic cell layer 41 is about 600 Å. A hardmask layer 45 (e.g., an oxide layer, of about 700 Å) may be provided over top electrode material 44.

Figure 4B:
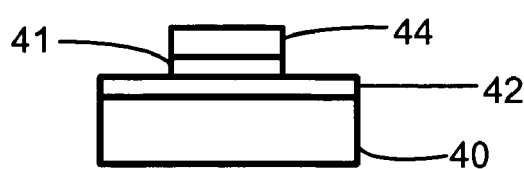

To obtain the structure of FIG. 4B, hardmask layer 45 is patterned via a photoresist and etched, and top electrode material 44 is patterned and etched. After patterning and etching of these layers, magnetic cell layer 41 is patterned and etched, for example, by ion beam etching (IBE) or reactive-ion etching (RIE), which also removes any hardmask layer 45. The resulting structure, in FIG. 4B, has an unpatterned bottom electrode material 42 on substrate 40, overwhich are patterned cell layer 41 and top electrode material 44.

Figure 4C:
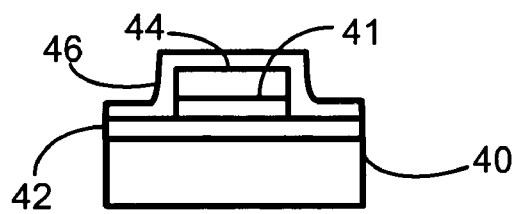
Figure 4D:
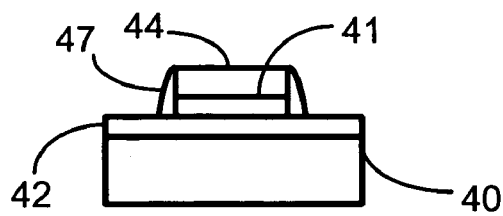

A layer of spacer material 46, for example SiN at a thickness of about 500 Å, is deposited over the structure in FIG. 4C. Spacer material layer 46 is etched in FIG. 4D (e.g., using reactive-ion etching) resulting in a vertical layer 47 radially around cell layer 41 and top electrode material 44. Vertical spacer layer 47 protects cell layer 41 during subsequent processing, such as wet chemistry processing and to inhibit corrosion in the ferromagnetic layers of cell layer 41.

Figure 4E:
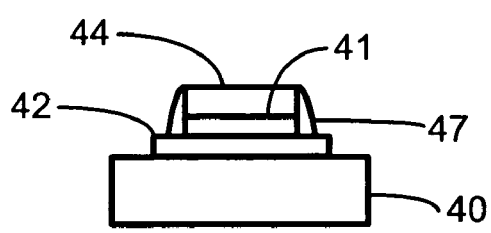

In FIG. 4E, bottom electrode material 42 is patterned and etched to provide a bottom electrode with a dog-bone, dumbbell, or H-shape. Substrate material 48 (e.g., dielectric or oxide material), which may be the same material or different than substrate 40, is deposited around the various layer to top electrode 44.

Figure 4F:
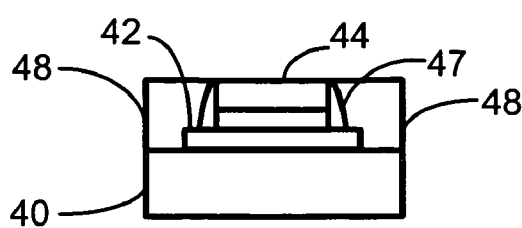

The resulting structure from FIG. 4F is the structure of FIGS. 2 and 3, which has bottom electrode 30 larger than magnetic cell 20. Because of the processing steps to form bottom electrode 30, internal stresses form in bottom electrode 30 and magnetic cell 20, as discussed above. Because of these stresses, the magnetic element (which includes cell 30 and electrode 20) has a magnetic hysteresis loop with a hard axis along the major-axis or x-direction of magnetic cell 30 even though the shape and magnetic anneal of magnetic cell 30 are designed for the easy axis along the major-axis or x-direction. FIG. 3 illustrates the designed easy axis 32 and the actual easy axis 34. Combined with the positive magnetostriction of any pinning layer (e.g., SAF layer) in cell 30 and any free layer (e.g., free layer 12 of magnetic cell 11 of FIG. 1), this creates a complicated magneto-elastic energy term which causes the deviation of the designed easy axis from the x-direction 32.

The sizes of axial stress relaxation components (i.e., $\sigma_x$ and $\sigma_y$) of a bottom electrode are dependent on the shape of that bottom electrode. For embodiments such as magnetic cell 30 and electrode 20 of FIGS. 2 and 3, where magnetic cell 30 is on necked portion 24 of electrode 20, the y-axis component of the magneto-elastic energy term will be bigger than the x-axis component. This large stress difference may cant the pinning/reference layer (e.g., pinning layer 15 of cell 11 of FIG. 1) and the free layer (e.g., free layer 12 of cell 11 of FIG. 1) magnetic easy axis away from the x-axis, and in some embodiments even fix it at about 90 degrees from the x-direction to the y-direction. It has been found that this cant (e.g., 90 degree turn) occurs when magnetic cell 30 is positioned on a long narrow bottom electrode (e.g., necked portion 24 of electrode 20).

Figure 5:
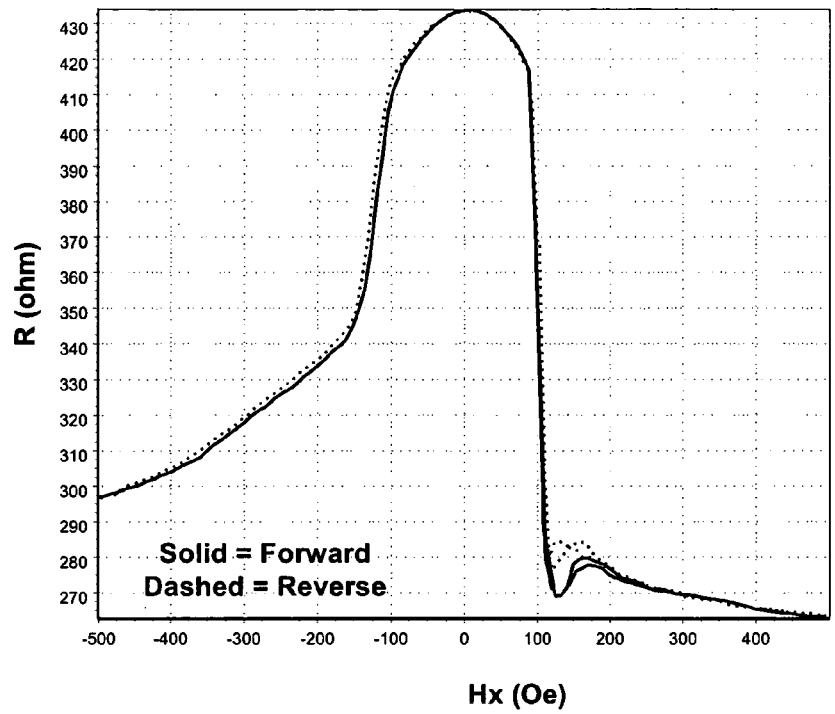
FIG. 5 is a graphical representation of the magnetization hysteretic of a magnetic element made by a "BE last" process along the x-direction.
Figure 6:
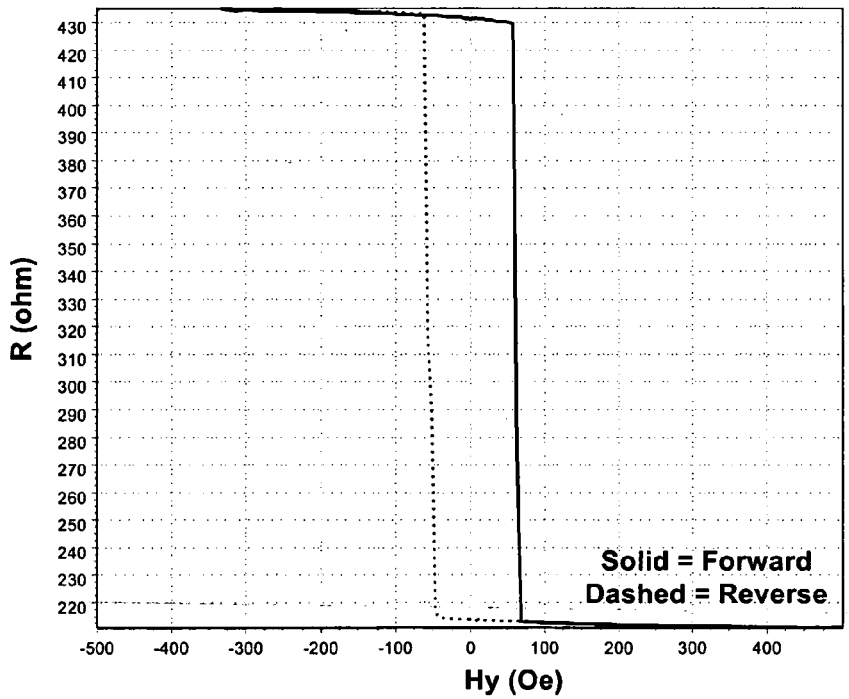
FIG. 6 is a graphical representation of the magnetization hysteretic of the magnetic element made by a "BE last" process along the y-direction.

FIGS. 5 and 6 illustrate the magnetic hysteresis loops of magnetic elements that are formed from a "BE last" process, such as described in respect to FIGS. 4A-4F, and which have a dog-bone, dumbbell, or H-shaped bottom electrode, such as bottom electrode 20 of FIG. 2. The magnetic test (i.e., resistance to magnetic field (R-H) hysteresis loop) was evaluated in order to characterize the magnetic performance of the magnetic element. The results show unwanted magnetic cell magnetic hard axes orientations along the y-axis or with significant canting from the x-axis. FIGS. 5 and 6 are examples of the magnetic hysteresis loops which show a magnetic hard axis along the y-direction rather easy axis along the x-direction.

Figure 7:
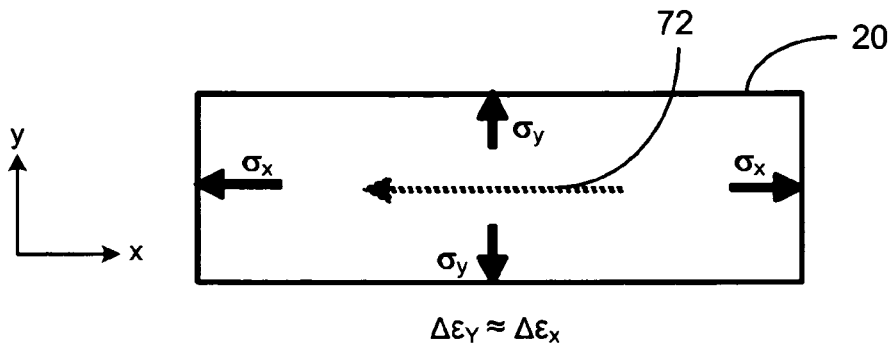
FIG. 7 is a schematic illustrating the substrate stress relaxation effect on the bottom electrode of a magnetic element made by a "BE first" process.

As indicated above, bottom electrode 20 and magnetic cell 20 of FIG. 2 may alternately be made by a "BE first" process. Illustrated in FIG. 7 are compressive stress vectors σ (sigma) for the major or x-axis of cell 30 and for the minor or y-axis of cell 30 induced by the stresses of bottom electrode 20, when made by a "BE first" process. These stress vectors are designated as $\sigma_x$ and $\sigma_y$, respectively. FIG. 7 also designates the strain ε (epsilon) that results from stress relaxation (i.e., the change in the stress). As indicated in FIG. 7, the change in strain along the y-axis is similar to the change in strain along the x-axis.

When bottom electrode 20 is shaped prior to the shaping of magnetic cell 30, as described in the method below, after bottom electrode 20 is patterned, electrode 20 and magnetic cell 30 are surrounded or encased in a spacer or dielectric material (e.g., an oxide), the entire structure which is then processed (e.g., planarized). Because of this, the stresses within bottom electrode 20 are countered (relaxed) by the surrounding material, forming a strain on bottom electrode 20. The result is less strain induced to electrode 20 when formed by a "BE first" process than a "BE last" process. Bottom electrode 20 has an intrinsic compressive stress, which bows electrode 20. When electrode 20 is relaxed, it becomes flat again, which creates a compressive stress on magnetic cell 30 along the both x- and y-directions, as illustrated in FIG. 7. FIG. 7 also illustrates the designed easy axis 72 of magnetic cell 30. As can be seen, there is little or no canting of the easy axis away from the x-axis or x-direction due to less stress relaxation of bottom electrode 20.

FIGS. 8A-8H illustrate a method for making a magnetic element where the bottom electrode is shaped or patterned prior to forming the magnetic cell.

Figure 8A:
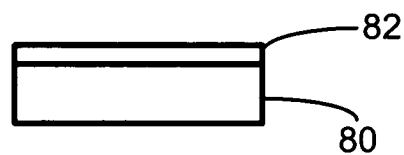
FIGS. 8A-8H are schematic step-wise diagrams of a "BE first" method of making a magnetic element according to this disclosure, such as the element of FIG. 2.
Figure 8B:
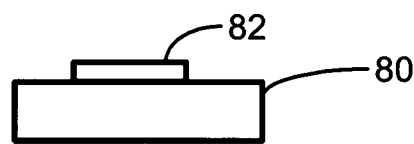

In FIG. 8A, a substrate 80 is provided as the base for the magnetic element. Substrate 80 may be, for example, a dielectric or an oxide material such as $SiO_2$, $Al_2O_3$, FSG (fluorinated silicate glass), doped $SiO_2$, SiN or MgO. Bottom electrode material 82 is provided on substrate 80. Examples of suitable materials for electrode material 82 include TiN, TaN, Cu, and W, at, for example, a thickness of about 1000 Å. Bottom electrode material 82 is patterned in FIG. 8B to the desired size with photoresist and etching.

Figure 8C:
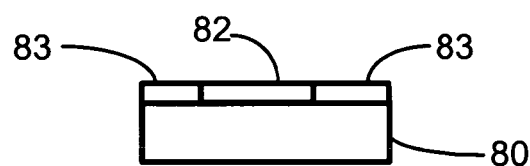
Figure 8D:
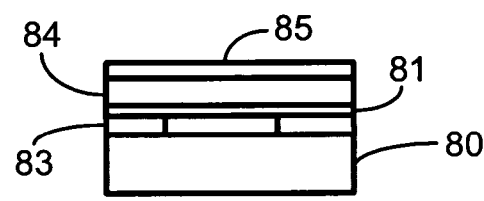

After electrode material 82 is patterned, additional substrate material 83 (e.g., dielectric or oxide material, e.g., $SiO_2$) is deposited as filler on substrate 80 around bottom electrode 82 in FIG. 8C. Additional material 83 may be the same as or different than substrate 80. Oxide polishing, e.g., via chemical-mechanical polishing (CMP) levels material 83 to bottom electrode material 82 so that the resulting element has a planarized surface. The internal stresses of electrode material 82 are relaxed by the surrounding material 83. This results in less stresses to the magnetic cell layer (applied subsequently) induced by bottom electrode material 82 when the cell is eventually patterned. From the polishing, sufficient bottom electrode 82 is exposed for reliable contact with the subsequently built magnetic cell.

A magnetic cell layer 81 (in some embodiments having a thickness of about 600 Å) is applied over planarized bottom electrode material 82 and material 83. Over this is applied a second electrode material 84 and a hardmask layer 85. Examples of suitable materials for electrode material 84 include TiN, TaN, Cu, and W at a thickness of about 2000 Å and for hardmask layer 85 include oxides at a thickness of about 700 Å.

Figure 8E:
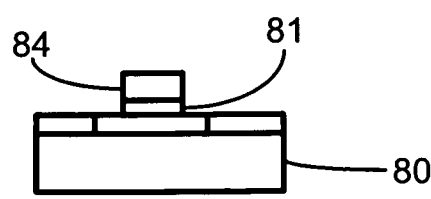

To obtain the structure of FIG. 8E, hardmask layer 85 is patterned via a photoresist and etched, and top electrode material 84 is patterned and etched. After patterning and etching of these layers, magnetic cell layer 81 is patterned and etched, for example, by ion beam etching (IBE) or reactive-ion etching (RIE), which also removes any remaining hardmask layer 85. The resulting structure has patterned cell layer 81 and top electrode material 84 over patterned bottom electrode material 82.

Figure 8F:
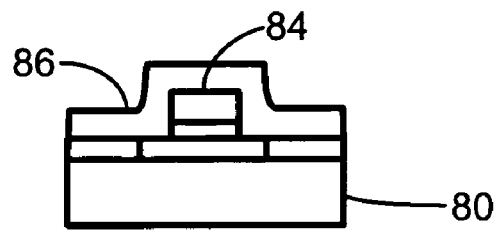
Figure 8G:
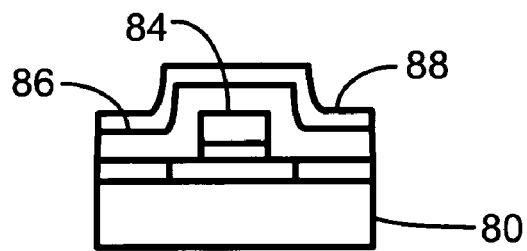

A layer of spacer material 86 (e.g., SiN, for example, at a thickness of about 500 Å) is deposited over the structure in FIG. 8E to form the structure of FIG. 8F. An optional layer of dielectric material 88 (e.g., $SiO_2$, in some embodiments at a thickness of about 5000 Å), is deposited over spacer material 86, forming the structure of FIG. 8G. Polishing, e.g., via chemical-mechanical polishing (CMP) levels dielectric material 88 and spacer material 86 to top electrode material 84 so that the resulting element has a planarized surface in FIG. 8H.

Figure 8H:
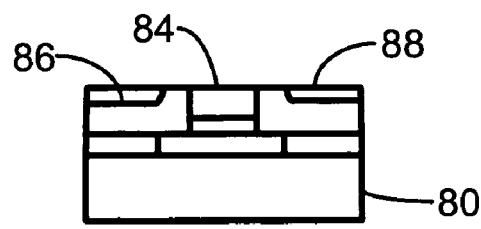

The resulting structure of FIG. 8H is a magnetic element that has first electrode 82 on substrate 80, the electrode having an area. Additional substrate (e.g., oxide) material 83 encompasses first electrode 82, with first electrode 82 and oxide material 83 forming a planar surface. Magnetic cell 81 is adjacent first electrode 82, with magnetic cell 81 having an area less than the area of first electrode 82. Second electrode 84 is adjacent magnetic cell 81 opposite first electrode 82. The area of second electrode 84 may be the same area as the area of magnetic cell 81. Spacer material 83 encompasses magnetic cell 81 and second electrode 84. Oxide layer 88 may cover a portion of spacer material 83 and may also encompass magnetic cell 81 and second electrode 84. Dielectric material 88, spacer layer 86 and second electrode 84 form a planar surface.

The resulting structure from FIG. 8H is the structure of FIG. 2, which has its bottom electrode larger than the corresponding magnetic cell. Because of the processing steps to form and shape bottom electrode 82 prior to applying magnetic cell 81, internal stresses in bottom electrode 82 and magnetic cell 81 are minimized. It is to be understood that the "BE first" process is not limited to electrodes having a shape as illustrated in FIG. 2. In most embodiments, the bottom electrode will have an aspect ratio (i.e., length in x-direction/width in y-direction) of at least 1, often much greater than 1 (e.g., at least about 2, in some embodiments at least about 3). In some embodiments, the width of the electrode (i.e., in the y-direction, as indicated in FIG. 2) is at least the same as the width of the magnetic cell in the same direction, and in some embodiments, the width of the electrode is at least twice (2×) the cell width, and in some embodiments at least thrice (3×) the cell width.

Figure 9:
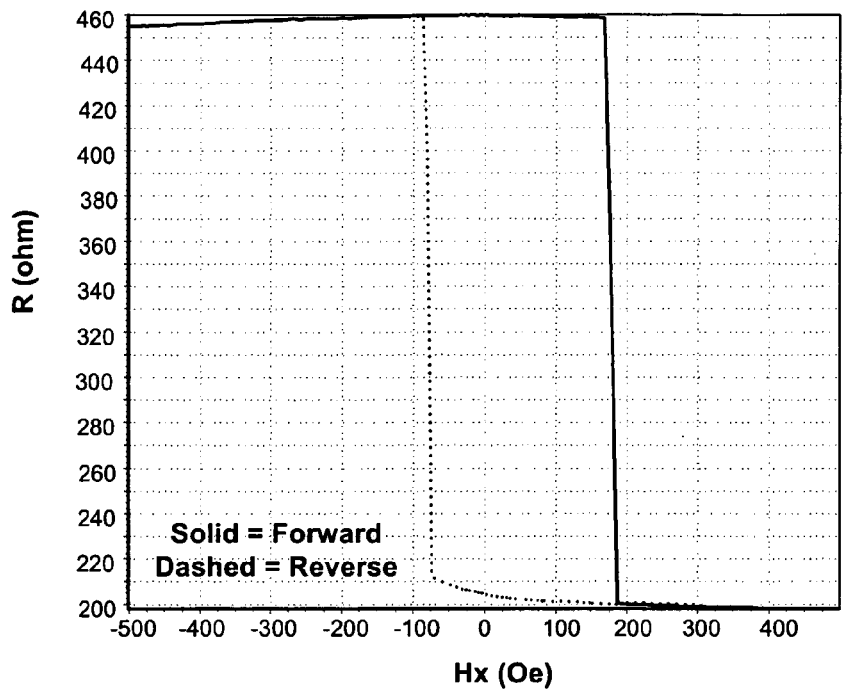
FIG. 9 is a graphical representation of the magnetization hysteretic of the magnetic element made by a "BE first" process along the x-direction.
Figure 10:
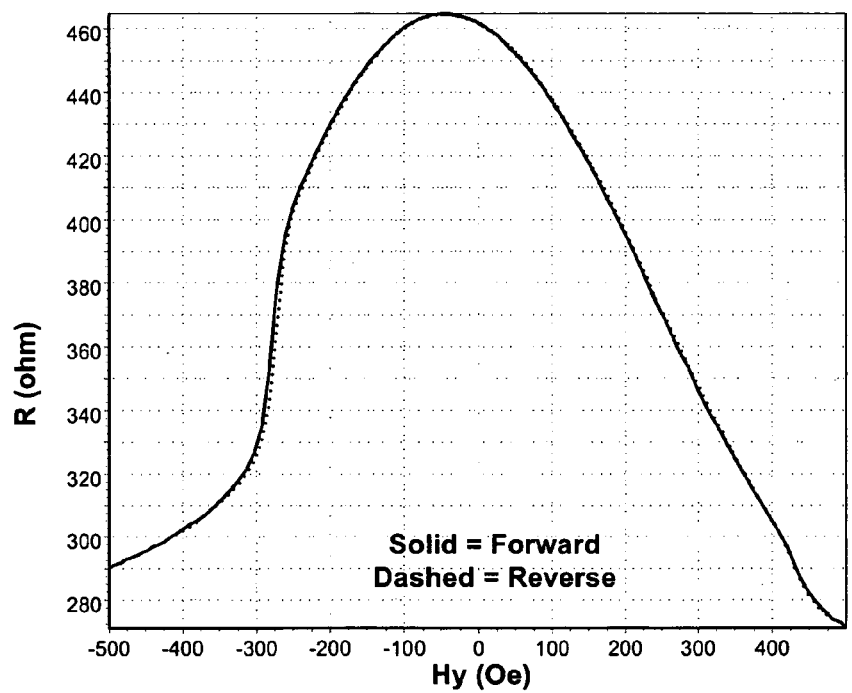
FIG. 10 is a graphical representation of the magnetization hysteretic of the magnetic element made by a "BE first" process along the y-direction.

FIGS. 9 and 10 illustrate the magnetic hysteresis loops of magnetic elements that are formed from a "BE first" process, such as described in respect to FIGS. 8A-8H, and which have a dog-bone, dumbbell or H-shaped bottom electrode, such as bottom electrode 20 of FIG. 2. The magnetic test (i.e., resistance to magnetic field (R-H) hysteresis loop) was evaluated to characterize the magnetic performance of the magnetic element from the integrated "BE first" process. The results show, in FIG. 7, that the magnetic cell easy axis 72 is along the x-axis, which is the desired orientation. Because bottom electrode 20 is stress-relaxed before magnetic cell 30 is built on electrode 20, the magnetic easy axes directions of the free and pinning/reference layers are less perturbed. The magnetic resistance hysteresis loop in FIGS. 9 and 10 clearly shows that a "BE first" process integrates magnetic cell responses to its easy axis (x-axis) by magnetic field sweep.

Figure 11:
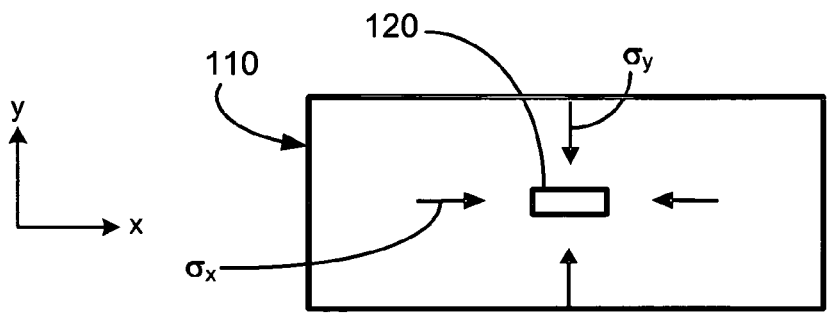
FIG. 11 is a schematic top view of a magnetic element positioned on a substrate.
Figure 12:
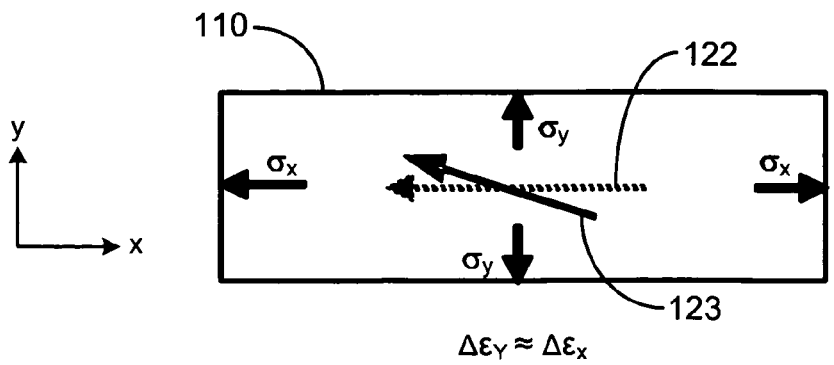
FIG. 12 is a schematic illustrating the substrate stress relaxation effect on the bottom electrode of the magnetic element of FIG. 11.

FIG. 11 illustrates a magnetic cell 120 on a bottom electrode 110. Magnetic cell 120 may be, for example, magnetic cell 11 from FIG. 1, described above. Bottom electrode 110 and magnetic cell 120 are similar to magnetic cell 30 and electrode 20 from FIG. 2, described above, unless indicated otherwise. A significant different from electrode 20 to electrode 110 of FIG. 12 is that bottom electrode 110 does not have a necked portion and corresponding free spaces proximate magnetic cell 120. Rather bottom electrode 110 has an increased area having a width (in the y-direction) that is constant along its length (in the x-direction). In most embodiments, bottom electrode 110 and magnetic cell 120 will have the same aspect ratio (i.e., length in x-direction/width in y-direction), of at least 1, often much greater than 1 (e.g., at least about 2, in some embodiments at least 3). In some embodiments, the ratio of the length (in the x-direction) of bottom electrode 110 to cell 120 is at least 2:1, in other embodiments, at least 3:1. Additionally or alternatively, in some embodiments, the ratio of the width (in the y-direction) of bottom electrode 110 to cell 120 is at least 2:1, in other embodiments, at least 3:1. The ratio of the area of electrode 110 to the area of magnetic cell may be at least 2:1, at least 4:1, in other embodiments, at least 5:1 or at least 6:1.

Magnetic cell 120 and electrode 110 can be prepared by either forming the shape of bottom electrode 110 after shaping magnetic cell 120 in a "BE last" procedure or by forming the shape of bottom electrode 110 before the formation of cell 120 in a "BE first" procedure, both procedures being generally explained above.

Illustrated in FIG. 12 are stress vectors σ (sigma) for the major or x-axis of cell 120 and for the minor or y-axis of cell 120. These stress vectors are designated as $\sigma_x$ and $\sigma_y$, respectively. The strain that results from stress relaxation (i.e., the change in the stress is also designated in FIG. 12, as ϵ (epsilon). Although there is stress relaxation of bottom electrode 110 when processed with "BE last" integration method, it is significantly less than when the bottom electrode has a necked portion and free spaces. As illustrated in FIG. 12, the change in the x- and y-strain components of bottom electrode 110 exerted on magnetic cell 120 are approximately equal. The pinning/reference and free layer directions would be less perturbed by the bottom electrode stress relaxation and, therefore, the magnetic cell easy axis 124 cants little or none from the x-axis 122.

Figure 13:
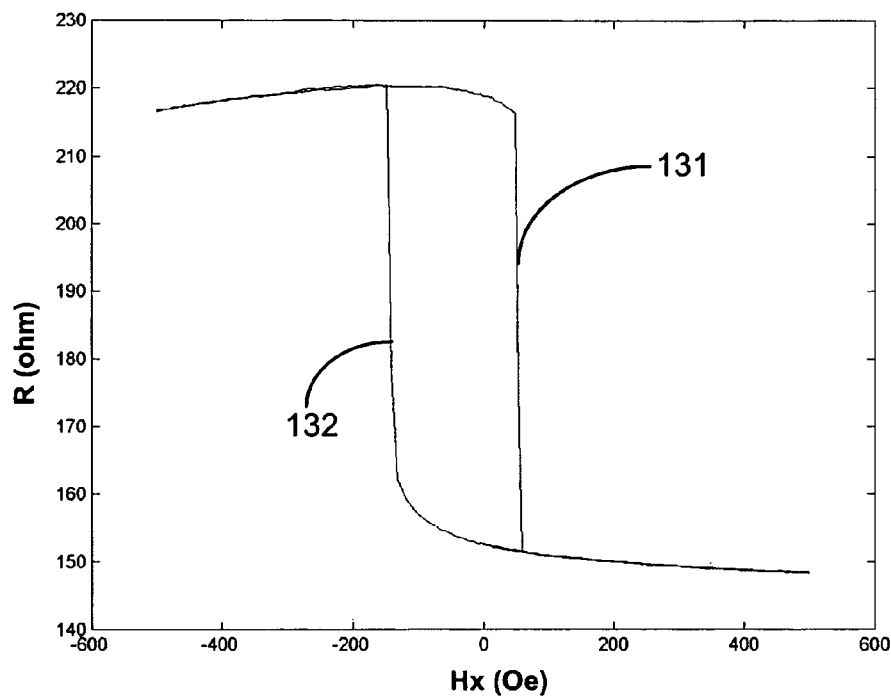
FIG. 13 is a graphical representation of the magnetization hysteretic of the magnetic element of FIG. 11 along the x-direction.
Figure 14:
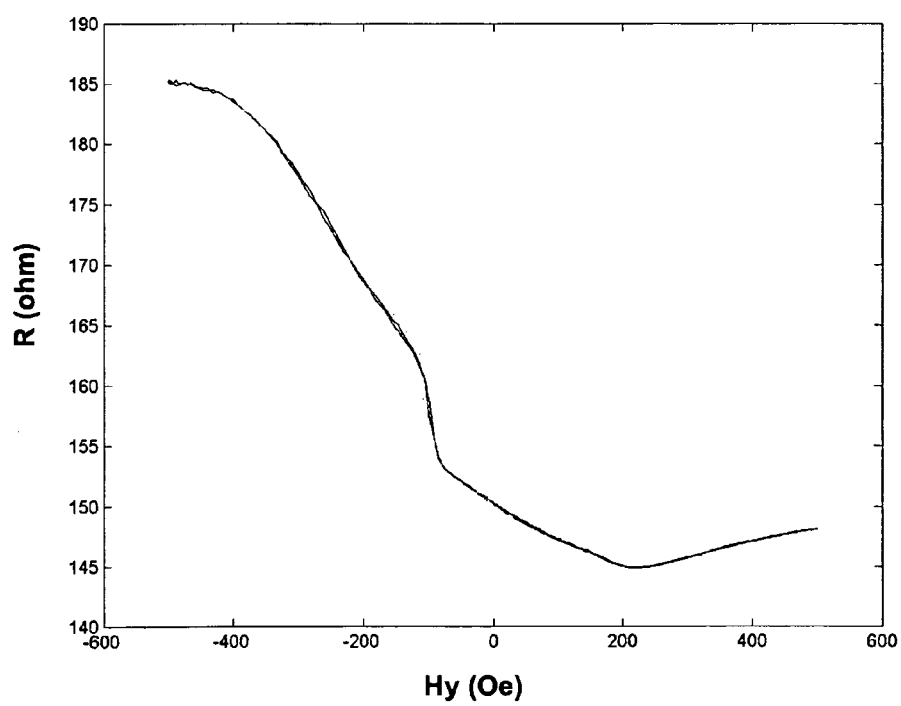
FIG. 14 is a graphical representation of the magnetization hysteretic of the magnetic element of FIG. 11 along the y-direction.

FIGS. 13 and 14 illustrate the magnetic hysteresis loops of magnetic elements having an increased bottom electrode size (e.g., magnetic cell 120 with bottom electrode 110). Line 131 represents forward and line 132 represents reverse in FIG. 13; in FIG. 14, forward and reverse are largely equal. These graphs show that the magnetization orientation of the magnetic cell remains along the x-axis even when processed by the "BE last" process, when its bottom electrode size is sufficiently larger than the magnetic cell and with no proximate necked portions.

The present disclosure provides various embodiments of magnetic elements and methods of forming magnetic elements that have a reduced stress between the magnetic cell and the bottom electrode. One embodiment includes forming the bottom electrode prior to the adjacent cell (i.e., "BE first" process). Another embodiment includes forming the bottom electrode with an increased area, either by forming the shape of bottom electrode prior to the adjacent cell (i.e., "BE first") or by forming the shape of the bottom electrode after the adjacent cell (i.e., "BE last").

Thus, embodiments of the MAGNETIC STACK DESIGN WITH DECREASED SUBSTRATE STRESS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of making a magnetic element comprising:
   patterning a first electrode material to form a first electrode on a substrate, wherein patterning the first electrode material to form a first electrode comprises patterning the first electrode material to form a dog-bone shaped first electrode;
   depositing filler on the substrate around the first electrode;
   polishing to form a planar surface comprising the filler and the first electrode; and
   forming a magnetic cell on the planar surface and a second electrode on the magnetic cell.

2. The method of claim 1 wherein depositing filler comprises depositing dielectric filler comprising $SiO_2$, $Al_2O_3$, FSG (fluorinated silicate glass), doped $SiO_2$, SiN or MgO.

3. The method of claim 1 wherein the first electrode material and the second electrode material comprise TiN, TaN, Cu or W.

4. The method of claim 3 wherein patterning a first electrode material comprises patterning a first electrode material with a thickness of about 1000 Å.

5. The method of claim 1 wherein polishing comprises chemical-mechanical polishing (CMP).

6. The method of claim 1 wherein forming a magnetic cell comprises forming a magnetic cell comprising a first ferromagnetic layer having a pinned magnetization orientation, a second ferromagnetic layer having a switchable magnetization orientation, and a non-magnetic layer therebetween.

7. The method of claim 6 wherein forming a magnetic cell comprises forming a magnetic cell having a thickness of about 600 Å.

8. The method of claim 6 wherein forming a magnetic cell comprises providing a magnetic cell layer and etching the layer to form the magnetic cell.

9. The method of claim 8 wherein etching the magnetic cell layer comprises ion beam etching (IBE) or reactive-ion etching (RIE).

10. The method of claim 1 wherein forming a second electrode comprises forming a second electrode having a thickness of about 2000 Å.

11. The method of claim 1 further comprising depositing a spacer layer over the second electrode and polishing the spacer layer to form a planar surface.

12. The method of claim 1 wherein the dumbbell shaped first electrode has a width at least twice a width of the magnetic cell.

13. The method of claim 1 wherein:
patterning a first electrode material to form a first electrode comprises forming the first electrode with an aspect ratio, and
forming a magnetic cell comprises forming the magnetic cell with an aspect ratio, wherein the aspect ratio of the magnetic cell is the same as the aspect ratio of the first electrode.

* * * * *